United States Patent
Shima

(10) Patent No.: US 8,508,268 B2
(45) Date of Patent: Aug. 13, 2013

(54) PLL CIRCUIT, CALIBRATION METHOD AND WIRELESS COMMUNICATION TERMINAL

(75) Inventor: Takahiro Shima, Kanagawa (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/816,049

(22) PCT Filed: Feb. 17, 2012

(86) PCT No.: PCT/JP2012/001075
§ 371 (c)(1),
(2), (4) Date: Feb. 8, 2013

(87) PCT Pub. No.: WO2012/120795
PCT Pub. Date: Sep. 13, 2012

(65) Prior Publication Data
US 2013/0141146 A1 Jun. 6, 2013

(30) Foreign Application Priority Data
Mar. 7, 2011 (JP) ................................. 2011-049211

(51) Int. Cl.
*H03L 7/06* (2006.01)
(52) U.S. Cl.
USPC .......................................... 327/156; 327/147
(58) Field of Classification Search
USPC ................................................ 327/147, 156
See application file for complete search history.

(56) References Cited

U.S. PATENT DOCUMENTS

| | | | | |
|---|---|---|---|---|
| 4,847,569 A * | 7/1989 | Dudziak et al. | ................. | 331/25 |
| 7,333,423 B2 * | 2/2008 | Palaskas et al. | ............... | 370/210 |
| 7,856,212 B2 * | 12/2010 | Pellerano et al. | ............... | 455/76 |
| 8,279,014 B2 * | 10/2012 | Chen et al. | ....................... | 331/34 |
| 2005/0083089 A1 * | 4/2005 | Starr | ............................ | 327/156 |
| 2008/0238495 A1 | 10/2008 | Tachibana et al. | | |
| 2009/0072911 A1 * | 3/2009 | Ke et al. | .......................... | 331/16 |
| 2009/0206894 A1 * | 8/2009 | Wang et al. | .................... | 327/157 |
| 2010/0171535 A1 * | 7/2010 | Shanan | ........................ | 327/157 |
| 2011/0267146 A1 * | 11/2011 | Finocchiaro et al. | ............ | 331/2 |
| 2013/0120073 A1 * | 5/2013 | Okada et al. | .................. | 331/1 A |

FOREIGN PATENT DOCUMENTS

| | | |
|---|---|---|
| JP | 2005-167795 A | 6/2005 |
| JP | 2008-236557 A | 10/2008 |
| JP | 2009-225438 A | 10/2009 |

OTHER PUBLICATIONS

International Search Report, mailed Apr. 3, 2012, for International Application No. PCT/JP2012/001075, 3 pages.

* cited by examiner

*Primary Examiner* — Adam Houston
(74) *Attorney, Agent, or Firm* — Seed IP Law Group PLLC

(57) ABSTRACT

An ILFD controller sets a control parameter on the basis of a frequency of a frequency-divided signal and a frequency of a reference signal measured by a clock counter. A VCO controller selects an oscillation band that defines an oscillation frequency of a VCO and also selects an oscillation band of the VCO on the basis of the frequency of the reference signal and a frequency of a frequency-divided signal that is a result obtained by frequency-dividing an output signal, which is delivered from the VCO in response to the selected oscillation band, by means of an ILFD and a frequency divider.

10 Claims, 12 Drawing Sheets

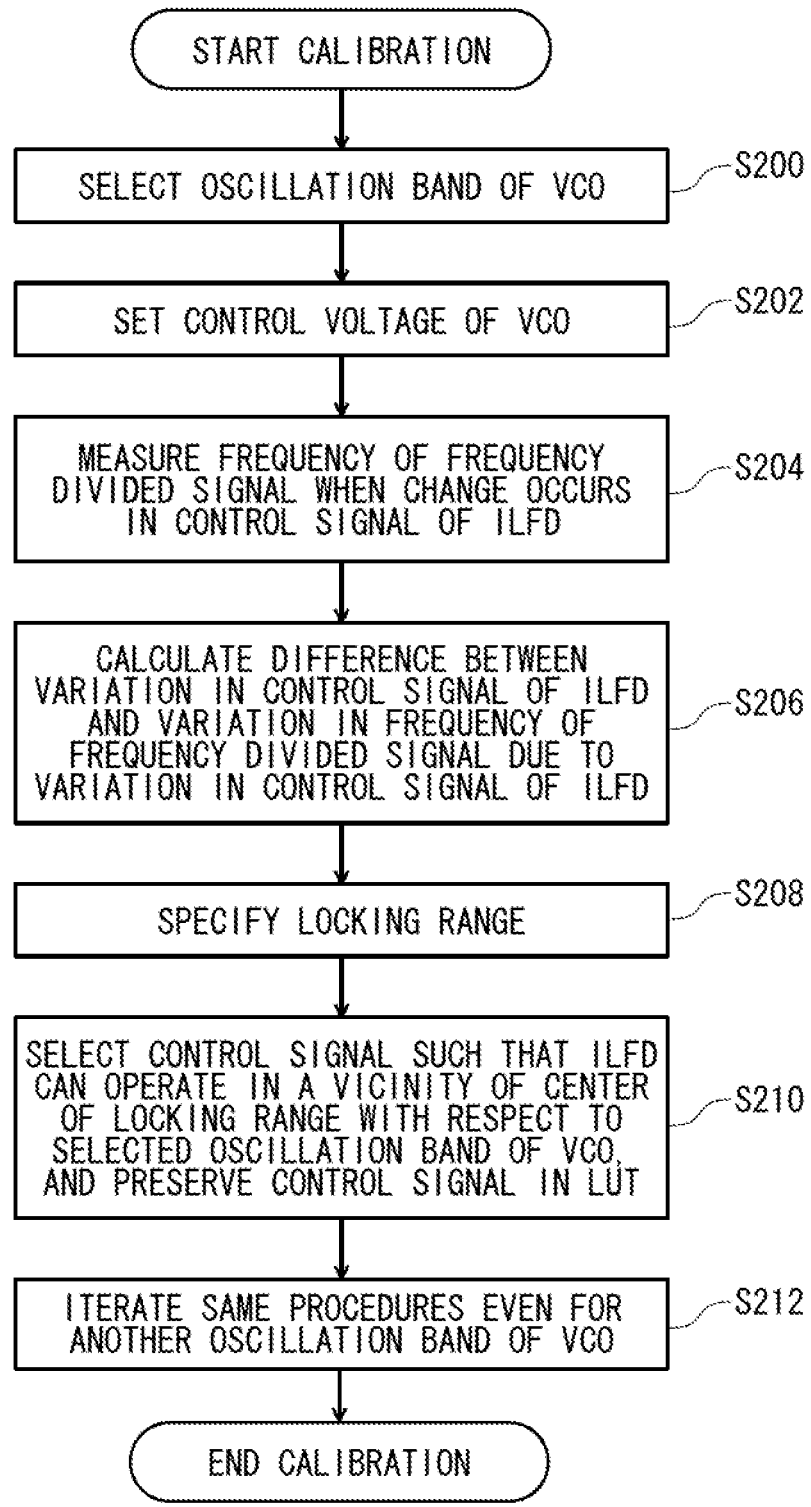

PLL CIRCUIT, CALIBRATION METHOD AND WIRELESS COMMUNICATION TERMINAL

TECHNICAL FIELD

The invention relates to a PLL circuit using an injection locked frequency divider, a calibration method, and a wireless communication terminal.

BACKGROUND ART

Recently prevalent, portable wireless communication terminals have been desired to exhibit faster processing speed, and a PLL (phase locked loop) circuit that operates at a high frequency band is indispensable as a frequency synthesizer to wireless communication.

The PLL circuit has a configuration including a frequency divider that subjects a high frequency band signal to a low frequency band signal by means of frequency division. An injection locked frequency divider (ILFD) capable of high speed operation at a very high frequency band of 10 GHz or more is used as a frequency divider.

The injection locked frequency divider has a narrow locking range (an operation band). In order to activate the injection locked frequency divider over a wide frequency band, a calibration method for controlling the lock range in agreement with a desired frequency has been required (see; for instance, Patent Literature 1).

FIG. 10 is a circuit diagram of a PLL circuit using a related art injection locked frequency divider described in connection with Patent Literature 1. FIG. 11 is a flowchart for describing calibration of the PLL circuit using the related art injection locked frequency divider described in connection with Patent Literature 1.

As shown in FIG. 10, a PLL circuit 100 includes a voltage controlled oscillator (VCO) 101, an injection locked frequency divider 103, a frequency divider 105, a phase frequency detector+charge pump 108, a loop filter 110, a calibration circuit 114, and a lookup table 115. The voltage controlled oscillator is hereunder abbreviated simply as VCO.

In the PLL circuit 100, an output signal 102 derived by oscillation of the VCO 101 is injected (input) to the injection locked frequency divider 103, where the signal is frequency-divided up to a low frequency signal 104 of the order of 10 GHz. The frequency signal 104 is input to the frequency divider 105, where the frequency signal is frequency-divided to a frequency of a reference signal 107 by the frequency divider 105.

The phase frequency detector+charge pump 108 compares a signal (a frequency-divided signal 106) output from the frequency divider 105 with the reference signal 107, converting a component of an error between a phase and a frequency into an electric current 109. The electric current 109 is input to the loop filter 110. In accordance with the input electric current 109, the loop filter 110 generates a control voltage 112 for the VCO 101.

The VCO 101 is controlled by the control voltage 112, thereby diminishing the error detected by the phase frequency detector+charge pump 108. The PLL circuit 100 thereby operates as a circuit that performs frequency negative feedback operation.

The calibration circuit 114 adjusts (calibrates) a control value of a control signal 113 for the injection locked frequency divider 103 at an oscillation band of the VCO 101 by use of the reference signal 107 and the frequency-divided signal 106 from the frequency divider 105. By means of the control signal 113, the injection locked frequency divider 103 can operate in a vicinity of the center of the locking range of the injection locked frequency divider 103.

Calibration procedures of the PLL circuit 100 are described by reference to FIGS. 10 and 11.

The calibration circuit 114 selects an oscillation band of the VCO 101 by use of a band selection signal 111 (S200). The band selection signal 111 is output from the calibration circuit 114.

The calibration circuit 114 sets the control voltage 112 of the VCO 101 (S202). For instance, the calibration circuit 114 sets a predetermined value (e.g., Vdd/2) as the control voltage 112.

The calibration circuit 114 measures a frequency of the frequency-divided signal 106 when a change occurs in the control value of the control signal 113 for the injection locked frequency divider 103 (S204).

The calibration circuit 114 calculates a difference between a variation in control value of the control signal 113 of the injection locked frequency divider 103 and a variation in frequency of the frequency-divided signal 106 (S206).

On the basis of a calculation result yielded in step S206, the calibration circuit 114 specifies a locking range of the injection locked frequency divider 103 with respect to an oscillation band of the VCO 101 selected in step S200 (S208).

On the basis of an ascertainment result yielded in step S208, the calibration circuit 114 selects, at the selected oscillation band of the VCO 101, a control value of the control signal 113 by means of which the injection locked frequency divider 103 can operate in the vicinity of the center of the locking range of itself (S210). The calibration circuit 114 stores the control value of the control signal 113 selected in step S210 in the lookup table 115.

The calibration circuit 114 selects another oscillation band in the VCO 101 and repeats operation from steps S202 to S210 (S212). The PLL circuit 100 can store the control value of the optimum control signal 113 of the injection locked frequency divider 103 to each of the oscillation bands of the VCO 101 into the lookup table 115.

CITATION LIST

Patent Literature

Patent Literature 1: Specification of U.S. Pat. No. 7,856,212

SUMMARY OF INVENTION

Technical Problem

FIGS. 12A and 12B are graphs showing a relationship between the control value (the control voltage) of the control signal 113 for the injection locked frequency divider 103 and a frequency of the frequency-divided signal 106 that has been frequency-divided by the frequency divider 105. FIG. 12A shows a case where a change interval is made short. FIG. 12B is a case where the change interval is made long.

The injection locked frequency divider 103 operates as a frequency divider in synchronism with the input control signal 113 within a frequency range of the locking range. For this reason, the frequency of the frequency-divided signal 106 becomes substantially constant without regard to an amount of change in control value of the control signal 113 within the locking range.

The injection locked frequency divider 103 does not operate as a frequency divider within a frequency range outside the locking range and outputs a signal having a predetermined free-running frequency. Therefore, the frequency of the frequency-divided signal 106 linearly changes, outside the locking range, in accordance with an amount of change of the control value of the control signal 113.

Under the calibration method for the PLL circuit described in connection with Patent Literature 1, the locking range of the injection locked frequency divider 103 is specified on the basis of a variable difference in the frequency of the frequency-divided signal 106. Hence, the control value of the control signal 113 must be changed at a very short interval.

When the change interval (the amount of change in control value) of the control signal 113 is short as shown in FIGS. 12A and 12B, the locking range can be specified. However, when the change interval is made long, specifying the lock range becomes difficult.

Accordingly, in order to specify the locking range of the injection locked frequency divider 103 with high accuracy, the control signal 113 must be changed at a very short interval. For this reason, the number of calculations becomes larger, as a result of which specifying the lock range involves consumption of longer time.

Further, operation is iterated in each of the oscillation bands. Accordingly, additional calculations equivalent to the number of oscillation bands are required. For this reason, entire calibration operation requires a very long time.

The invention has been conceived in light of the circumstances of the related art and aims at providing a PLL circuit that makes an injection locked frequency divider operable within a short period of time in a locking range and that appropriately sets an oscillation band of a voltage controlled oscillator, to thus stably acquire a desired frequency, as well as providing a calibration method and a wireless communication terminal.

Solution to Problem

According to one aspect of the present invention, there is provided a PLL circuit comprising:

a voltage controlled oscillator configured to output a high frequency signal;

an injection locked frequency divider configured to frequency-divide the output high frequency signal;

a frequency divider configured to frequency-divide the frequency-divided signal into a frequency of a reference signal;

a phase frequency detector configured to compare the frequency-divided signal from the frequency divider with the reference signal and configured to output a phase difference and a frequency difference;

a charge pump configured to convert the output phase difference and the frequency difference into an electric current;

a loop filter configured to generate a control voltage for the voltage controlled oscillator in accordance with the thus-converted electric current and configured to apply the generated control voltage to the voltage controlled oscillator; and a calibration circuit configured to control an oscillation band which determines an oscillation frequency of the voltage controlled oscillator and configured to control a control parameter for activating the injection locked frequency divider in a determined operating range, wherein the calibration circuit is configured to adjust the oscillation band of the voltage controlled oscillator in accordance with a frequency-divided signal of the adjusted injection locked frequency divider after adjustment of the control parameter of the injection locked frequency divider.

According to another aspect of the present invention, there is provided a calibration method comprising:

deactivating operation of a voltage controlled oscillator configured to output a high frequency signal;

measuring a frequency of a frequency-divided signal which is obtained by frequency-dividing in accordance with a control signal including a control parameter of an injection locked frequency divider for frequency-dividing the high frequency signal and a frequency of a determined reference signal;

setting the control parameter of the injection locked frequency divider in accordance with the measured frequency of the frequency-divided signal and the frequency of the reference signal;

releasing the voltage controlled oscillator from a deactivated state;

selecting an oscillation band that determines an oscillation frequency of the voltage controlled oscillator; and selecting the oscillation band of the voltage controlled oscillator on the basis of a frequency of a frequency-divided signal that is obtained by frequency-dividing a signal, which is output from the voltage controlled oscillator according to the selected oscillation band, by means of the injection locked frequency divider and the frequency divider, and a frequency of the reference signal.

According to still another aspect of the present invention, there is provided a wireless communication terminal comprising:

the PLL circuit defined in any one of the above;

a modulator configured to modulate a baseband transmission signal;

a transmission mixer configured to produce, by means of frequency conversion, a carrier frequency from a first local signal output from the PLL circuit and the modulated transmission signal; and a receiving mixer configured to produce, by means of frequency conversion, a baseband signal from a second local signal output from the PLL circuit and a received signal; and a demodulator configured to demodulate the frequency-converted received signal.

Advantageous Effects of Invention

The invention makes the injection locked frequency divider operable in a short period of time within a locking range and can appropriately set an oscillation band of a voltage controlled oscillator, to thus stably gain a desired frequency.

BRIEF DESCRIPTION OF DRAWINGS

FIG. 11 is a flowchart for explaining calibration of the PLL circuit using the related art injection locked frequency divider.

DESCRIPTION OF EMBODIMENTS

Embodiments of a PLL circuit of the invention are hereunder described by reference to the drawings. In the present invention, processing (steps) of a calibration circuit of the PLL circuit can also be expressed as a calibration method. Further, the invention can also be expressed as a wireless communication terminal that includes a PLL circuit as a local signal source.

First Embodiment

Figure 1:
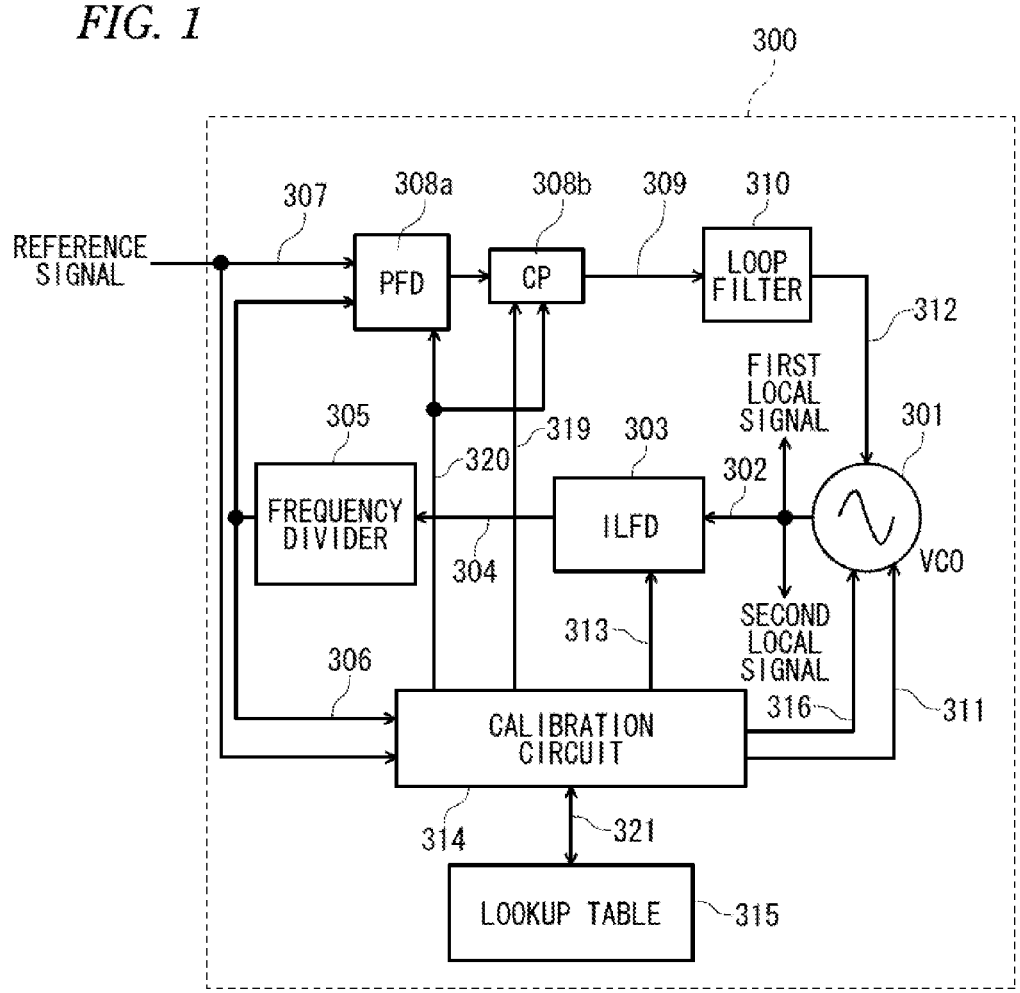
FIG. 1 is a block diagram showing an internal configuration of a PLL circuit of a first embodiment.
Figure 2:
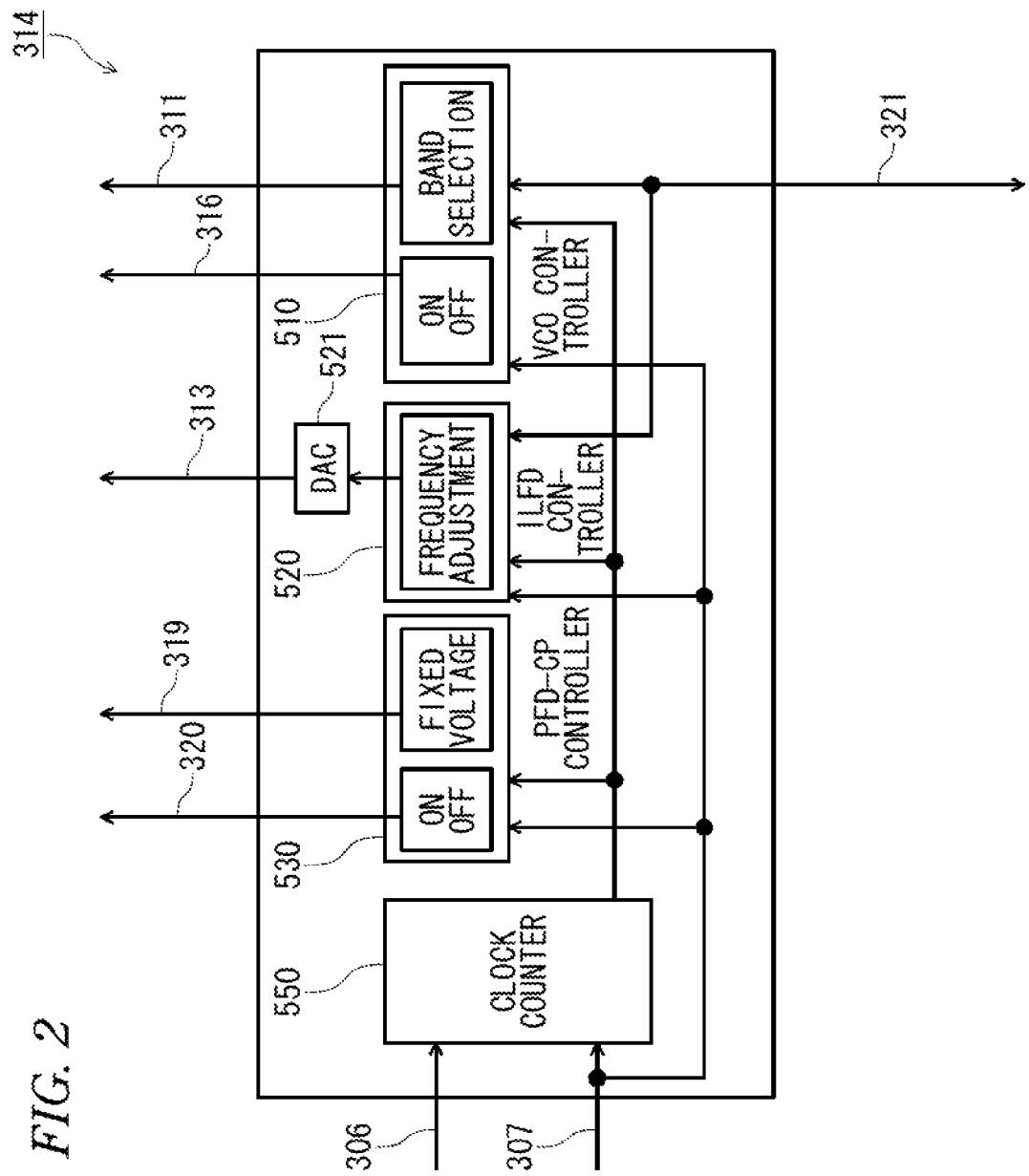
FIG. 2 is a block diagram showing an internal configuration of a calibration circuit of the PLL circuit of the first embodiment.

FIG. 1 is a block diagram showing an internal configuration of a PLL circuit 300 of a first embodiment. FIG. 2 is a block diagram showing an internal configuration of a calibration circuit 314 of the PLL circuit 300 of the first embodiment.

A configuration of the PLL circuit 300 is now described.

As shown in FIG. 1, the PLL circuit 300 includes a voltage controlled oscillator (VCO) 301, an injection locked frequency divider 303, a frequency divider 305, a phase frequency detector 308a (PFD: phase and frequency detector), a charge pump (CP: charge pump) 308b, a loop filter 310, the calibration circuit 314, and a lookup table 315.

Figure 5:
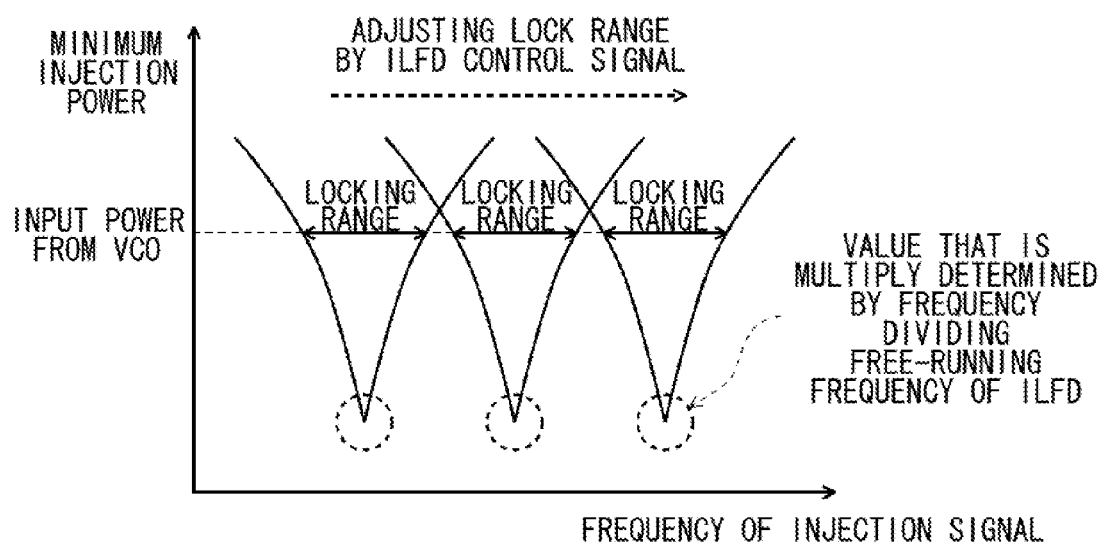
FIG. 5 is a drawing showing (a locking range characteristic) a characteristic of minimum injection power versus a frequency of a signal injected to an injection locked frequency divider of the first embodiment.

In the PLL circuit 300, the phase frequency detector 308a and the charge pump 308b are separately configured. However, they can also be configured as a single piece as shown in FIG. 5.

Operation of the PLL circuit 300 will be described.

In response to a VCO on-off signal 316 received as an input from the calibration circuit 314, the voltage controlled oscillator (VCO) 301 operates (works) as a voltage controlled oscillator or stops its operation.

For instance, in a case where details of the VCO on-off signal 316 represent "activate the VCO 301," the VCO 301 operates as a voltage controlled oscillator in response to the VCO on-off signal 316 received as an input.

For instance, in a case where the details of the VCO on-off signal 316 represent "deactivate the VCO 301," the VCO 301 stops its operation as the voltage controlled oscillator in response to the VCO on-off signal 316 received as an input.

While operating as the voltage controlled oscillator, the VCO 301 performs oscillation according to an oscillation frequency characteristic based on an oscillation band (see FIG. 6) that has been selected in accordance with a control voltage 312 from the loop filter 310 and a band selection signal 311 from the calibration circuit 314.

The VCO 301 outputs a high frequency output signal to the injection locked frequency divider 303 by means of oscillation of the oscillation frequency. A high frequency output signal 302 is input as a first local signal and a second local signal, which are shown in FIG. 3, to a transmission mixer 50a and a receiving mixer 50b, respectively.

In response to a control signal 313 from the calibration circuit 314, the injection locked frequency divider (ILFD) 303 acts as a frequency divider in synchronism with the output signal 302 received from (injected by) the VCO 301, frequency-dividing the output signal 302 by a predetermined factor. The injection locked frequency divider 303 outputs a frequency-divided signal 304 to the frequency divider 305.

The frequency divider 305 receives an input of the frequency-divided signal 304 from the injection locked frequency divider 303 and frequency-divides the thus-input frequency-divided signal 304 by a predetermined factor. The frequency divider 305 outputs a resultant frequency-divided signal 306 to the phase frequency detector 308a and the calibration circuit 314.

Figure 3:
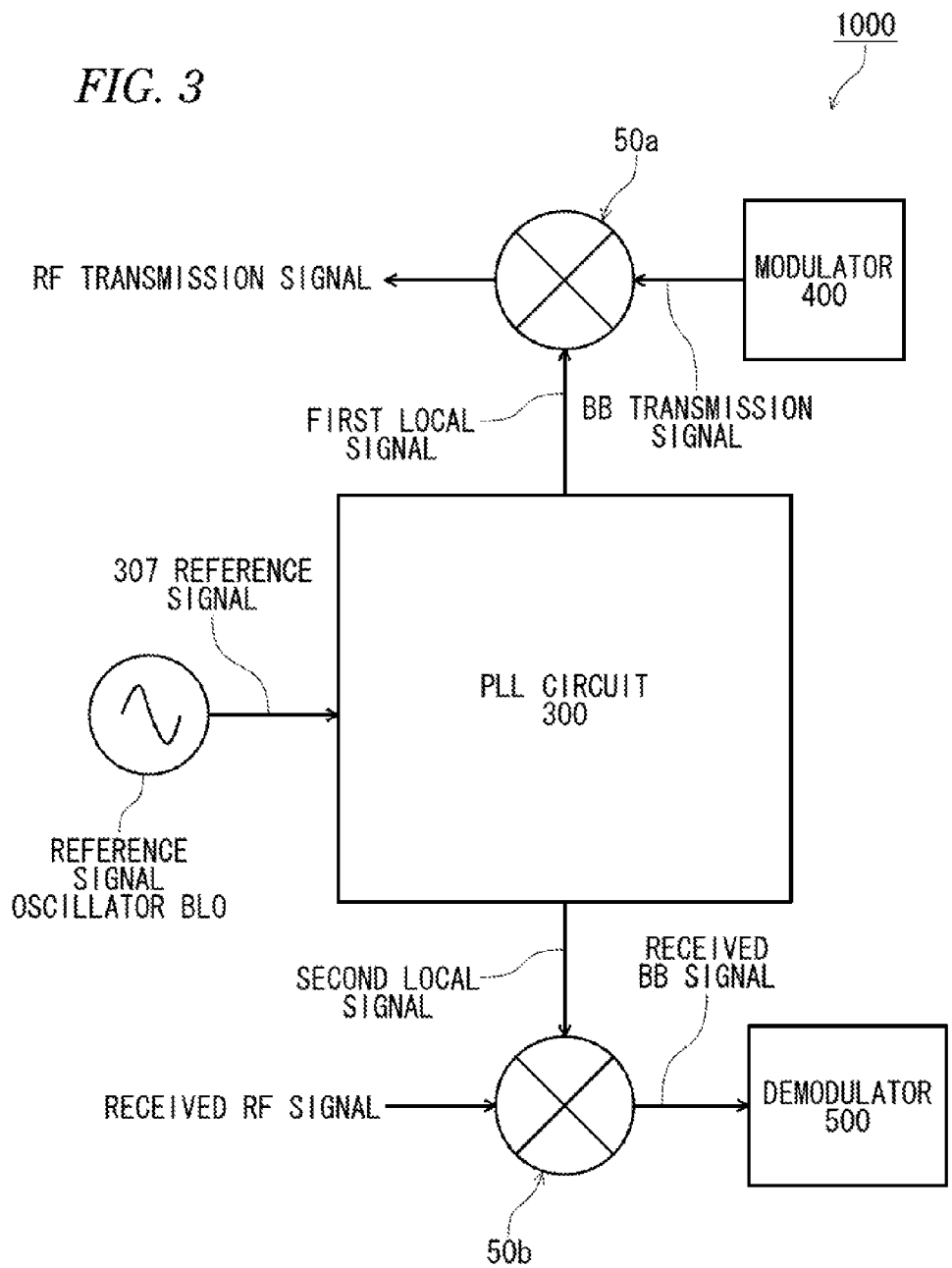
FIG. 3 is a block diagram showing a configuration of a wireless communication terminal including the PLL circuit of the first embodiment.

The phase frequency detector 308a compares the frequency-divided signal 306 from the frequency divider 305 with a reference signal 307 from a reference signal oscillator BLO shown in FIG. 3. The phase frequency detector 308a outputs a phase difference and a frequency difference between the frequency-divided signal 306 and the reference signal 307, which are comparison results, to the charge pump 308b.

The charge pump 308b converts the phase difference and the frequency difference, which are output from the phase frequency detector 308a, into an electric current 309 and outputs the electric current 309 to the loop filter 310.

In accordance with the electric current 309 output from the charge pump 308b, the loop filter 310 generates a control voltage of the VCO 301. The loop filter 310 outputs (applies) the thus-generated control voltage to the VCO 301.

A detailed configuration of the calibration circuit 314 is now described.

As shown in FIG. 2, the calibration circuit 314 includes a VCO controller 510, an ILFD controller 520, a PFD-CP controller 530, and a clock counter 550.

Detailed operation of the calibration circuit 314 is described. The reference signal 307 is input to respective sections of the calibration circuit 314. The calibration circuit 314 operates in accordance with the input reference signal 307.

The VCO controller 510 controls activation (ON) and deactivation (OFF) of the VCO 301 that outputs a high frequency signal. In order to activate the VCO 301, the VCO controller 510 outputs to the VCO 301 the VCO on-off signal 316 which activates the VCO 301. In order to deactivate the VCO 301, the VCO controller 510 outputs to the VCO 301 the VCO on-off signal 316 which deactivates the VCO 301.

In the middle of operation of the VCO 301, the VCO controller 510 outputs to the VCO 301 a band selection signal 311 for selecting an oscillation band (see FIG. 6) that defines an oscillation frequency characteristic of the VCO 301 corresponding to the control voltage 312.

The VCO controller 510 selects the oscillation band of the VCO 301 (the band selection signal 311) and stores the oscillation band (the band selection signal 311) in the lookup table 315.

The ILFD controller 520 sets a control parameter (the control signal 313) of the injection locked frequency divider 303 and stores the control parameter (the control signal 313) in the lookup table 315.

The ILFD controller 520 outputs to a DAC 521 a control signal including an initial value of the control parameter used for controlling an oscillation frequency of the injection locked frequency divider 303. In accordance with a measurement result of the clock counter 550, the ILFD controller 520 changes the control parameter for controlling a frequency in a frequency-divided signal of the injection locked frequency divider 303 to a desired frequency band. The ILFD controller 520 outputs to the DAC 521 a control signal including the changed control parameter.

An initial value of the control parameter is stored in the ILFD controller 520. The initial value of the control parameter is one that is set in order to control the oscillation frequency of the injection locked frequency divider 303 to a desired frequency band.

The DAC (digital analog converter) 521 receives as an input a control signal output from the ILFD controller 520 and converts the thus-input control signal into a voltage used for controlling the oscillation frequency of the injection locked frequency divider 303 or a frequency of the frequency-divided signal. The DAC 521 outputs (applies) the thus-converted control signal 313 to the injection locked frequency divider 303.

The PFD-CP controller 530 controls activation (ON) or deactivation (OFF) of the phase frequency detector 308a and the charge pump 308b. In order to activate the phase frequency detector 308a and the charge pump 308b, the PFD-CP controller 530 outputs a PFD-CP on-off signal 320 for activation purpose to the phase frequency detector 308a and the charge pump 308b.

In order to deactivate the phase frequency detector 308a and the charge pump 308b, the PFD-CP controller 530 outputs the PFD-CP on-off signal 320 for deactivation purpose to the phase frequency detector 308a and the charge pump 308b.

In order for the VCO controller 510 to select an oscillation band, the PFD-CP controller 530 outputs to the charge pump 308b a control signal 319 for fixing an output (the electric current 309) from the charge pump 308b to a preset value (see descriptions which will be provided later).

The clock counter 550 receives as inputs the reference signal 307 and the frequency-divided signal 306 that is produced as a result of the frequency-divided signal 304 from the injection locked frequency divider 303 being frequency-divided by the frequency divider 305.

The clock counter 550 measures a frequency of the input reference signal 307 and a frequency of the frequency-divided signal 306. An output of the clock counter 550 is delivered to the VCO controller 510, the ILFD controller 520, and the PFD-CP controller 530.

When the frequency of the reference signal 307 is; for instance, 100 MHz, the clock counter 550 counts the frequency-divided signal 306 every 110 clock pulses while counting the reference signal 307 every 100 clock pulses. The frequency-divided signal 306, in this case, assumes a frequency of 110 MHz.

FIG. 3 is a schematic diagram of a wireless communication terminal 1000 including the PLL circuit 300 of the first embodiment. The wireless communication terminal 1000 includes the reference signal oscillator BLO, the PLL circuit 300, a modulator 400, the transmission mixer 50a, the receiving mixer 50b, and a demodulator 500.

The PLL circuit 300 receives as an input an output signal (the reference signal 307) from the reference signal oscillator BLO and outputs, on the basis of the thus-input reference signal 307, a first local signal having a desired frequency to the transmission mixer 50a and a second local signal having a desired frequency to the receiving mixer 50b. The reference signal oscillator BLO can be configured by use of; for instance, a crystal transducer.

The transmission mixer 50a receives, as inputs, a baseband transmission signal modulated by the modulator 400 and the first local signal output from the PLL circuit 300. The transmission mixer 50a upconverts the baseband transmission signal (a BB transmission signal) into a high frequency transmission signal (an RF transmission signal) on the basis of the thus-input transmission signal and the first local signal. The high frequency transmission signal is transmitted by way of an antenna which is not shown in FIG. 3.

The receiving mixer 50b receives, as inputs, a received high frequency signal (a received RF signal) received by way of the antenna that is not shown in FIG. 3 and the second local signal output from the PLL circuit 300. The receiving mixer 50b downconverts the received high frequency signal into a received baseband signal (a received BB signal) on the basis of the input, received high frequency signal and the second local signal. The received baseband signal is demodulated into a transmission signal by means of the demodulator 500.

Figure 4:
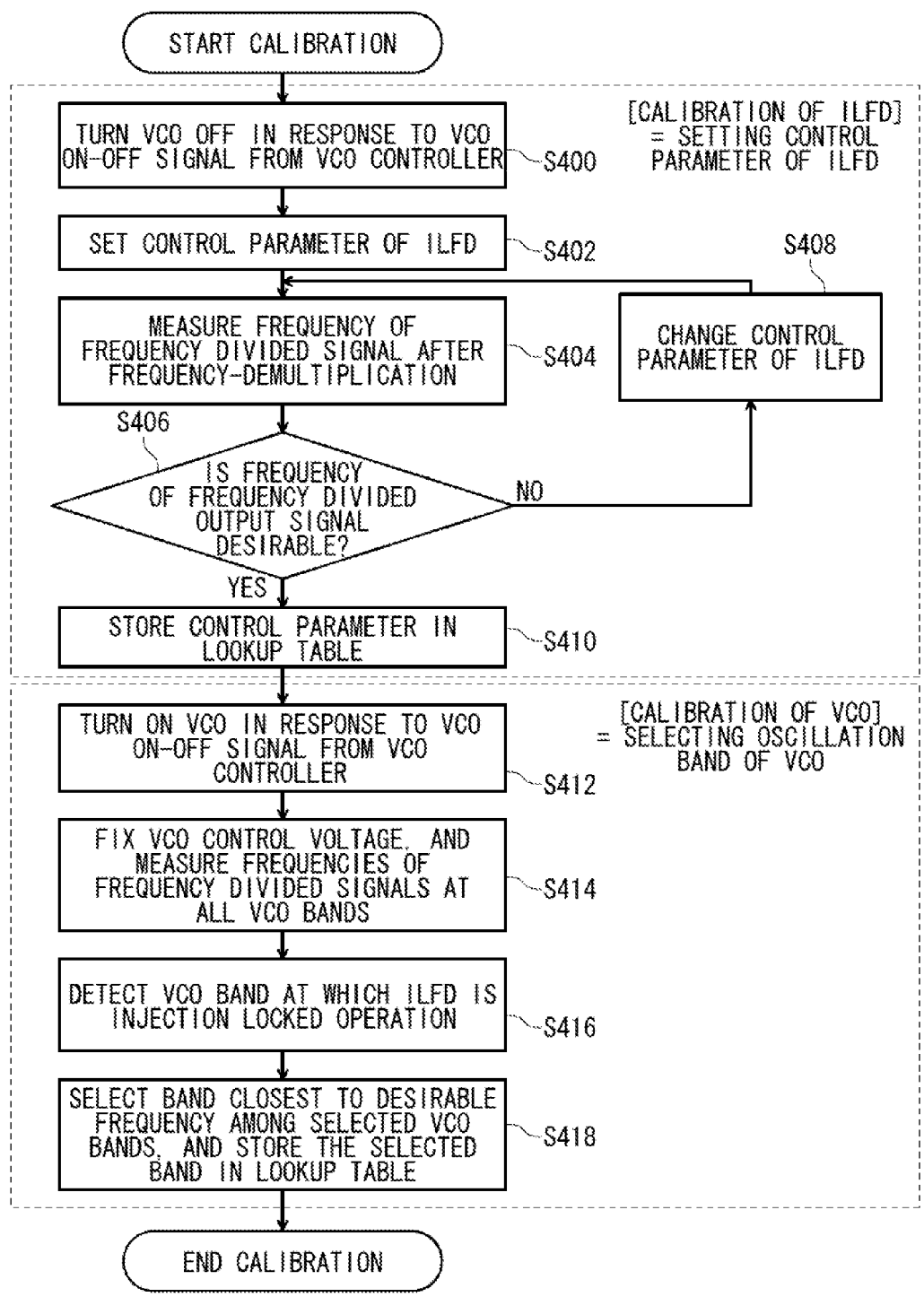
FIG. 4 is a flowchart for describing operation of the calibration circuit of the PLL circuit of the first embodiment.

FIG. 4 is a flowchart for explaining operation of the calibration circuit 314 of the PLL circuit 300 of the first embodiment.

In steps S400 to S410, the calibration circuit 314 sets calibration of the injection locked frequency divider 303: namely, a control parameter of the injection locked frequency divider 303.

In steps S412 to S418, the calibration circuit 314 selects calibration of the VCO 301; namely, an oscillation band of the VCO 301 for producing output signals (the first local signal and the second local signal) having respective desired frequencies.

(Calibration of the ILFD)

In FIG. 4, the VCO controller 510 outputs the VCO on-off signal 316, which is to deactivate the VCO 301, to the VCO 301 (S400). The VCO 301 is stopped by means of the inputs. Accordingly, since the injection locked frequency divider 303 is not synchronous to the signal output from the VCO 301, the injection locked frequency divider 303 operates as a voltage controlled oscillator rather than as a frequency divider.

The ILFD controller 520 outputs to the DAC 521 a control signal that includes an initial value of a control parameter for controlling an oscillation frequency of the injection locked frequency divider 303 (S402). The DAC 521 converts the control signal received from the ILFD controller 520 into the control signal 313 having the oscillation frequency equal to that of the injection locked frequency divider 303, applying the control signal 313 to the injection locked frequency divider 303 (S402).

In accordance with the control signal 313 applied in step S402, the reference signal 307 and the frequency-divided signal 306 that is a result of the output signal induced by oscillation of the injection locked frequency divider 303 being frequency-divided by the frequency divider 305 are input to the clock counter 550.

The clock counter 550 receives, as inputs, the reference signal 307 and the frequency-divided signal 306 that is a result of the frequency-divided signal 304 from the injection locked frequency divider 303 being frequency-divided by the frequency divider 305, and measures a frequency of the input reference signal 307 and a frequency of the frequency-divided signal 306 (S404).

When the frequency of the frequency-divided signal 306 is a previously specified, desirable frequency (YES in S406), processing pertaining to the calibration circuit 314 proceeds to step S410. Specifically, the VCO controller 510 stores the control parameter of the injection locked frequency divider 303 into the lookup table 315 (S410). The calibration circuit 314 thereby finishes calibrating the injection locked frequency divider 303.

When the frequency of the frequency-divided signal 306 is not the previously specified, desirable frequency (NO in S406), processing pertaining to the calibration circuit 314 proceeds to S408. Specifically, the ILFD controller 520 changes, on the basis of an output from the clock counter 550, a control parameter for controlling the oscillation frequency of the injection locked frequency divider 303 to a desired frequency band (S408). The ILFD controller 520 outputs a control signal including the changed control parameter to the DAC 521.

The desirable frequency referred to herein corresponds to a frequency having a margin of plus or minus a few percents with reference to a frequency of the reference signal. For instance, when an operation band (a locking range) of the injection locked frequency divider 303 falls within a range of plus or minus 3 GHz with reference to a neighborhood of 60 GHz, a specific operating band of the injection locked frequency divider 303 comes to plus or minus 5%.

This means that the injection locked frequency divider 303 performs normal operation (locking) so long as an operating frequency drift falls within a value of plus or minus 5% within the specific operating band. When the reference signal 307 is at a 100 MHz, the injection locked frequency divider 303 performs normal operation when the desirable frequency falls within a range from 95 to 105 MHz.

In accordance with the control signal 313 applied in step S408, the reference signal 307 and the frequency-divided signal 306 that is a result of the output signal induced by oscillation of the injection locked frequency divider 303 being frequency-divided by the frequency divider 305 are input to the clock counter 550.

After processing pertaining to step S408, processing pertaining to steps S404, S406, and S408 is iterated until the frequency of the frequency-divided signal 306 comes to the previously specified desirable frequency.

(Calibration of the VCO)

FIG. 5 is a graph showing a characteristic of minimum injection power versus a frequency of a signal injected to the injection locked frequency divider 303 of the first embodiment, showing a locking range characteristic versus the frequency of the signal injected to the injection locked frequency divider 303. The injected signal shows the signal 302 injected (input) to the injection locked frequency divider 303.

The locking range frequency of the injection locked frequency divider 303 can be controlled by changing the control signal 313. The center of the locking range frequency results in a frequency that is a multiple of frequency multiplication of the free-running frequency at which the injection locked frequency divider 303 runs (operates) as a voltage controlled oscillator. Accordingly, the locking range frequency of the injection locked frequency divider 303 can be easily controlled by controlling the free-running frequency of the injection locked frequency divider 303 that acts as the voltage controlled oscillator rather than as the frequency divider.

After processing pertaining to step S410, the VCO controller 510 activates the VCO 301 that has remained deactivated during calibration of the injection locked frequency divider 303. Hence, the VCO on-off signal 316 for turning on the VCO 301 is output to the VCO 301 (S412). The VCO 301 is thereby operated.

Accordingly, when synchronized to the output signal from the VCO 301, the injection locked frequency divider 303 operates as a frequency divider for frequency-dividing the output signal.

When the VCO controller 510 selects an oscillation band corresponding to a band number, the PFD-CP controller 530 outputs to the charge pump 308b the control signal 319 for fixing the electric current 309 from the charge pump 308b to a preset value (e.g., VDD/2) (S414).

The VCO controller 510 outputs to the VCO 301 a signal for determining an oscillation frequency characteristic of the VCO 301 corresponding to the control voltage 312 from the loop filter 310 on the basis of the fixed electric current 309; for instance, the band selection signal 311 for selecting an oscillation band of band number one (S414). Band numbers of oscillation bands of the VCO 301 range from 1 to N (N: a constant number) (see FIG. 6).

According to the oscillation band corresponding to the band selection signal 311 output from the VCO controller 510, the VCO 301 outputs to the injection locked frequency divider 303 the output signal 302 having an oscillation frequency corresponding to the control voltage 312.

On the basis of the control signal 313 corresponding to the control parameter stored in step S410, the injection locked frequency divider 303 frequency-divides the output signal 302 to a predetermined multiple in synchronism with the output signal 302 received from (injected by) the VCO 301. The injection locked frequency divider 303 outputs the frequency-divided signal 304 to the frequency divider 305.

The frequency divider 305 frequency-divides the frequency-divided signal 304, which is delivered from the injection locked frequency divider 303, by a predetermined factor, outputting the frequency-divided signal 306 resultant of frequency division to the phase frequency detector 308a and the clock counter 550.

The clock counter 550 receives, as inputs, the reference signal 307 and the frequency-divided signal 306 that has been frequency-divided by the frequency divider 305, and measures the frequency of the input reference signal 307 and a frequency of the frequency-divided signal 306. Respective sections of the calibration circuit 314, the VCO 301, the injection locked frequency divider 303, the frequency divider 305, the phase frequency detector 308a, the charge pump 308b, and the loop filter 310 operate likewise at all of the oscillation bands of the VCO 301. The VCO controller 510 thereby receives as results that are obtained by measuring frequencies of the frequency-divided signals 306 at all N oscillation bands (S414).

On the basis of the results that are obtained in step S414 by measuring frequencies of the frequency-divided signals 306 at all of the N oscillation bands, the VCO controller 510 detects an oscillation band at which the injection locked frequency divider 303 is injection locked operation within the lock range (S416).

Figure 6:
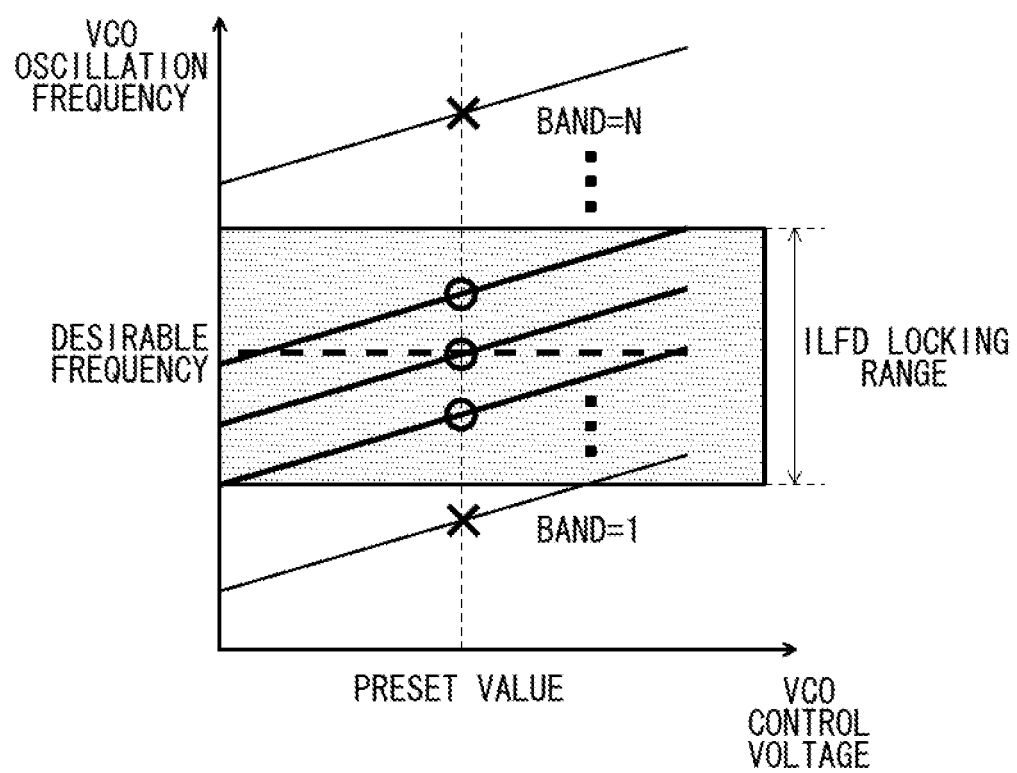
FIG. 6 is a graph showing an oscillation frequency characteristic of a VCO versus a control voltage of the VCO of the first embodiment and a locking range of the injection locked frequency divider.
Figure 7:
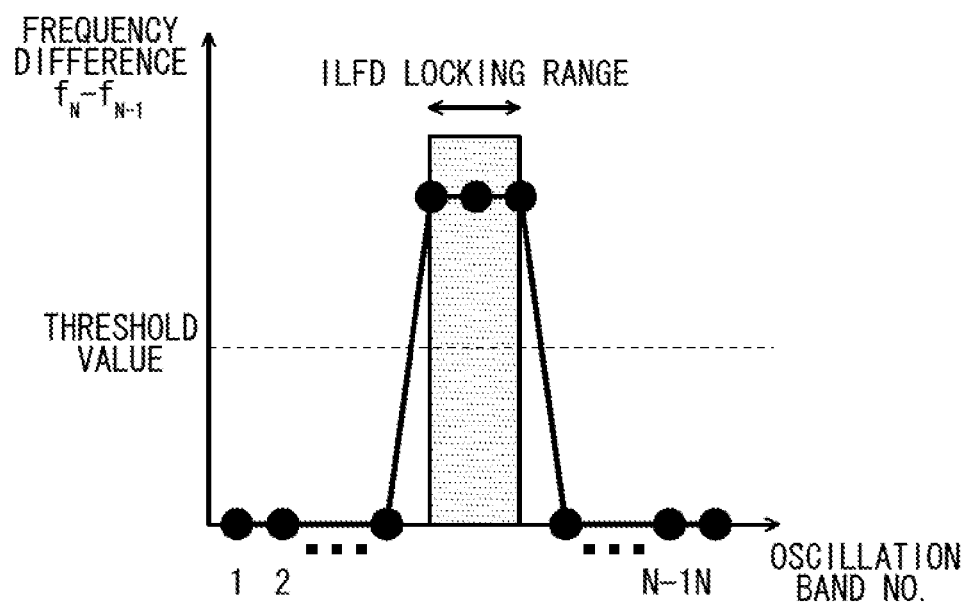
FIG. 7 is a graph showing a frequency difference ($f_N - f_{N-1}$) between frequency-divided signals appearing at respective adjacent oscillation bands of the VCO of the first embodiment.

By reference to FIGS. 6 and 7, explanations are given to a method for detecting an oscillation band at which the injection locked frequency divider is injection locked operation within the locking range. FIG. 6 is a graph showing an oscillation frequency characteristic of the VCO 301 versus the control voltage 312 of the VCO 301 of the first embodiment and the locking range of the injection locked frequency divider 303. As a band number increases, the oscillation frequency of the VCO 301 also increases monotonously.

The locking range of the injection locked frequency divider 303 is narrow, and the injection locked frequency divider 303 cannot perform injection locked operation in response to the injection signal from the VCO 301 at all of the N oscillation bands of the VCO 301.

As shown in FIG. 6, the injection locked frequency divider 303 performs injection locked operation in response to the injection signal from the VCO 301 at the oscillation band in a predetermined range (the locking range) in which the oscillation frequency of the VCO 301 obtained at the control voltage 312 having the predetermined value (e.g. VDD/2) includes a desirable frequency; namely, an oscillation band designated by a heavy solid line shown in FIG. 6.

FIG. 7 is a graph showing a frequency difference ($f_N-f_{N-1}$) between the frequency-divided signals 306 appearing at respective adjacent oscillation bands of the VCO 301 of the first embodiment. When the injection locked frequency divider 303 performs injection locked operation in response to an injection signal; namely, when the injection locked frequency divider 303 operates as a frequency divider within the locking range, the frequency of the frequency-divided signal 306 also monotonously increases with an increase in band number. For this reason, the frequency difference between the frequency-divided signals 306 appearing at adjacent band numbers exceeds a predetermined value (a threshold value) within the locking range.

The injection locked frequency divider 303 operates as a voltage controlled oscillator outside the locking range. Specifically, the injection locked frequency divider 303 outputs a signal having a free-running oscillation frequency. For this reason, a frequency difference between the frequency-divided signals 306 appearing at adjacent band numbers is substantially zero and less than the predetermined value (the threshold value).

In step S416, the VCO controller 510 computes a frequency difference between the frequency-divided signals 306 appearing at adjacent band numbers. On the basis of the band number at which the frequency difference exceeds the predetermined value (the threshold value), the VCO controller 510 detects band numbers where the injection locked frequency divider 303 performs injection locked operation; namely, the injection locked frequency divider 303 operates as a frequency divider within the locking range.

The VCO controller 510 storers in the lookup table 315 an oscillation band at which the frequency of the frequency-divided signal 306 becomes closest to a desirable frequency, among the oscillation bands detected in step S416 (S418). Calibration of the VCO 301 is thereby completed.

After processing pertaining to step S418, the PFD-CP controller 530 releases the output (the electric current 309) of the charge pump 308b achieved in step S414 from a fixed state. The calibration circuit 314 thereby finishes calibrating the VCO 301.

Accordingly, the PLL circuit 300 completes calibrating operation performed by the calibration circuit 314; namely, setting the control parameter of the injection locked frequency divider 303 and selection of the oscillation band of the VCO 301.

As above, even when variations occur in conditions including processes, a power voltage, and an ambient temperature, the PLL circuit 300 of the first embodiment makes the injection locked frequency divider 303 operable in the locking range within a short period of time. Thus, a desirable frequency can be stably obtained by appropriately setting the oscillation band of the VCO 301.

A calibration time consumed when the PLL circuit is calibrated by use of the related art injection locked frequency divider is determined as follows. Specifically, suppose the number of oscillation bands in the VCO is; for instance, eight (N=8) and the number of calculations (points) for specifying a locking range of the injection locked frequency divider per oscillation band is 21 (see FIG. 7(a)). The calibration time of the PLL circuit requires calculation of a total of 168 (=21×8) points.

In the meantime, a calibration time consumed when the PLL circuit 300 is calibrated by use of the injection locked frequency divider 303 of the first embodiment is determined as follows. Specifically, suppose the number of calibrations (S400 to S410 in FIG. 4) performed by the injection locked frequency divider 303 is about three and the number of oscillation bands of the VCO 301 is eight (N=8). The calibration time of the PLL circuit 300 requires calculation of a total of 11 (=3+8) points. When compared with the time consumed by calibrating the PLL circuit by use of the related art injection locked frequency divider, the calculation time comes to about one-fifteenth. Thus, faster calibration; namely, calibrating the VCO 301 and the injection locked frequency divider 303 within a shorter period of time, becomes possible.

The VCO controller 510 and the PFD-CP controller 530 can also deactivate the voltage controlled oscillator 301, the phase frequency detector 308a, and the charge pump 308b during calibration of the injection locked frequency divider 303 in steps S400 to S410.

The PLL circuit 300 can thereby curtail the electric power consumed during calibration of the injection locked frequency divider 303 in steps S400 to S410.

Likewise, the PFD-CP controller 530 can also deactivate the phase frequency detector 308a and the charge pump 308b during calibration of the VCO 301 in steps S412 to S418.

The PLL circuit 300 can thereby curtail the electric power consumed during calibration of the VCO 301 in steps S412 to S418.

Second Embodiment

Figure 8:
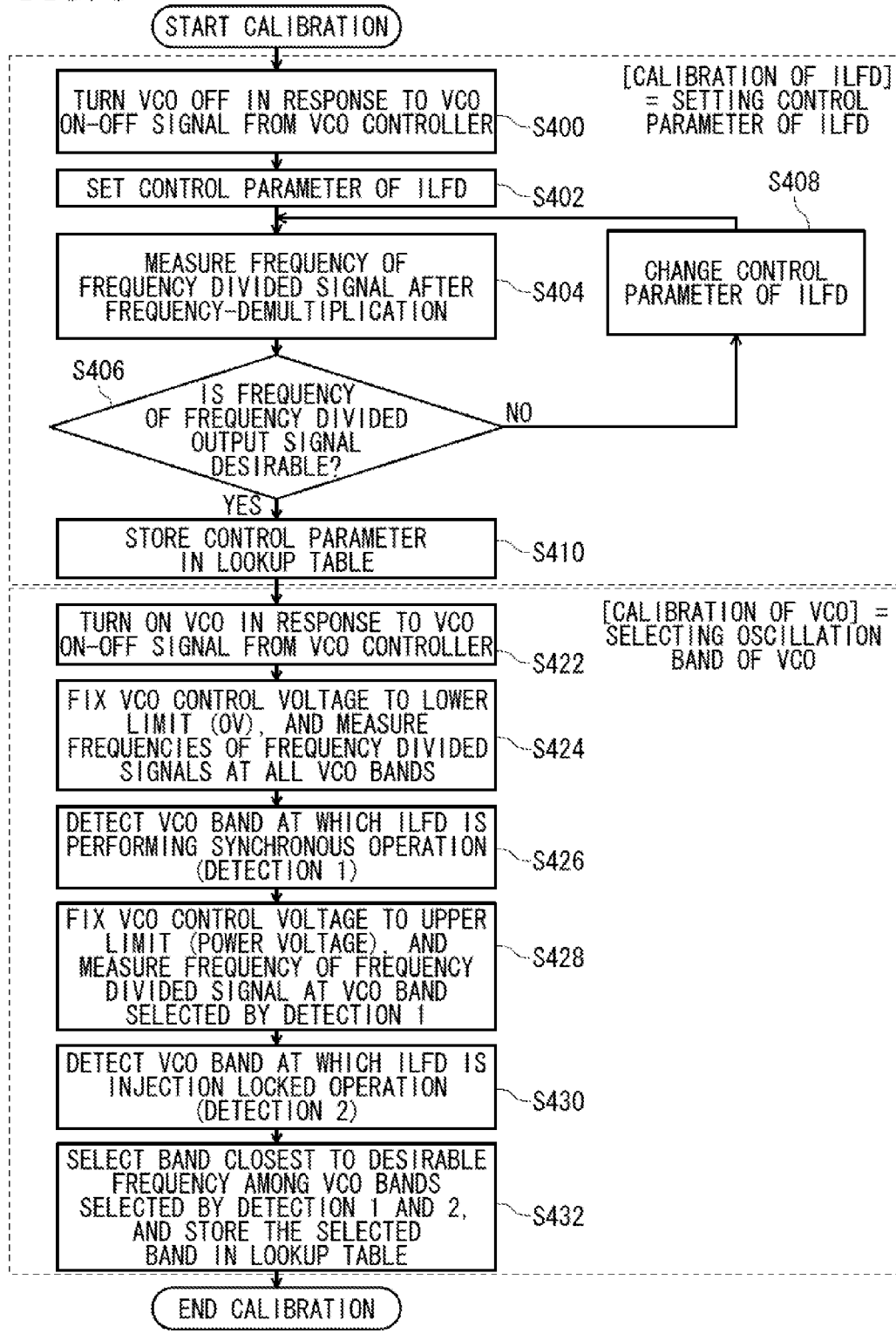
FIG. 8 is a flowchart for explaining operation of a calibration circuit of a PLL circuit of a second embodiment.

FIG. 8 is a flowchart for explaining operation of the calibration circuit 314 of the second embodiment. Since the PLL circuit 300 and the calibration circuit 314 of the second embodiment are identical with their counterparts of the first embodiment in terms of a configuration, and hence their explanations are omitted here for brevity. In FIG. 8, the constituent sections that are the same as those shown in FIG. 4 are assigned the same reference numerals, and their repeated explanations are omitted for brevity.

In steps S422 to S432, the calibration circuit 314 calibrates the VCO 301; namely, selects an oscillation band of the VCO 301 for obtaining output signals that each have desirable frequencies (the first local signal and the second local signal).

(Calibration of the ILFD)

In FIG. 8, calibration of the injection locked frequency divider 303 pertaining to steps S400 to S410; namely, procedures for setting the control parameters of the injection locked frequency divider 303, is identical with its counterpart described in connection with the first embodiment, and hence its repeated explanation is omitted here for brevity.

(Calibration of the VCO)

After processing pertaining to step S410, the VCO controller 510 turns on the VCO 301 which has remained deactivated during calibration of the injection locked frequency divider 303 and, therefore, outputs to the VCO 301 the VCO on-off signal 316 for turning on the VCO 301 (S422). The VCO 301 is thereby activated. Accordingly, when synchronized to an output signal from the VCO 301, the injection locked frequency divider 303 operates as a frequency divider for frequency-divides the output signal.

When the VCO controller 510 selects an oscillation band corresponding to the band number, the PFD-CP controller 530 outputs to the charge pump 308b the control signal 319 for fixing the electric current 309 from the charge pump 308b to a lower-limit preset value (e.g. 0V) (S424).

The VCO controller 510 outputs to the VCO 301 a signal for determining an oscillation frequency characteristic of the VCO 301 corresponding to the control voltage 312 from the loop filter 310 on the basis of the fixed electric current 309; for instance, the band selection signal 311 for selecting an oscillation band of band number one (S424). The band number of the oscillation band of the VCO 301 ranges from one to N (N: a constant number) (see FIG. 9).

According to the oscillation band corresponding to the band selection signal 311 output from the VCO controller 510, the VCO 301 outputs to the injection locked frequency divider 303 the output signal 302 whose oscillation frequency corresponds to the control voltage 312.

The injection locked frequency divider 303 frequency-divides the output signal 302 to a predetermined multiple on the basis of the control signal 313, which corresponds to the control parameter stored in step S410, in synchronism with the output signal 302 received from (injected by) the VCO 301. The injection locked frequency divider 303 outputs the frequency-divided signal 304 to the frequency divider 305.

The frequency divider 305 frequency-divides the frequency-divided signal 304, which is delivered from the injection locked frequency divider 303, by a predetermined factor, outputting the frequency-divided signal 306 resultant of frequency division to the phase frequency detector 308a and the clock counter 550.

The clock counter 550 receives as inputs the reference signal 307 and the frequency-divided signal 306 that has been frequency-divided by the frequency divider 305, and measures the frequency of the thus-input reference signal 307 and the frequency of the frequency-divided signal 306. The same operation is performed for all of the oscillation bands, and frequencies are measured (S424). The respective sections of the calibration circuit 314, the VCO 301, the injection locked frequency divider 303, the frequency divider 305, the phase frequency detector 308a, the charge pump 308b, and the loop filter 310 likewise operate at all of the oscillation bands. The VCO controller 510 thereby receives as inputs results that are obtained by measuring the frequencies of the respective frequency-divided signals 306 at all of the N oscillation bands (S424).

On the basis of results that are obtained by measuring the frequencies of the respective frequency-divided signals 306 at all the N oscillation bands measured in step S424, the VCO controller 510 detects an oscillation band at which the injection locked frequency divider 303 is injection locked operation within the locking range (S426). Since a method for detecting an oscillation band in step S426 is identical with that described in connection with step S416 shown in FIG. 4, its explanation is omitted.

After processing pertaining to step S426, the PFD-CP controller 530 outputs to the charge pump 308b the control signal 319 for fixing the electric current 309 from the charge pump 308b to an upper-limit preset value (e.g., a power voltage (VDD)) when the VCO controller 510 selects an oscillation band corresponding to the band number (S428).

The VCO controller 510 outputs to the VCO 301 a signal for determining an oscillation frequency characteristic of the VCO 301 corresponding to the control voltage 312 from the loop filter 310 on the basis of the fixed electric current 309; for instance, the band selection signal 311 for selecting an oscillation band of number one (S428). The band number of the oscillation band of the VCO 301 ranges from one to N (N: a constant number) (see FIG. 9).

According to the oscillation band corresponding to the band selection signal 311 output from the VCO controller 510, the VCO 301 outputs to the injection locked frequency divider 303 the output signal 302 whose oscillation frequency corresponds to the control voltage 312.

The injection locked frequency divider 303 frequency-divides the output signal 302 to a predetermined multiple on the basis of the control signal 313, which corresponds to the control parameter stored in step S410, in synchronism with the output signal 302 received from (injected by) the VCO 301. The injection locked frequency divider 303 outputs the frequency-divided signal 304 to the frequency divider 305.

The frequency divider 305 frequency-divides the frequency-divided signal 304, which originates from the injection locked frequency divider 303, to a predetermined multiple. The frequency-divided signal 306 is output to the phase frequency detector 308a and the clock counter 550.

The clock counter 550 receives as inputs the reference signal 307 and the frequency-divided signal 306 that has been frequency-divided by the frequency divider 305, and measures the frequency of the thus-input reference signal 307 and the frequency of the frequency-divided signal 306. The respective sections of the calibration circuit 314, the VCO 301, the injection locked frequency divider 303, the frequency divider 305, the phase frequency detector 308a, the charge pump 308b, and the loop filter 310 likewise operate at all of the oscillation bands of the VCO 301. The VCO controller 510 thereby receives as inputs results that are obtained by measuring the frequencies of the respective frequency-divided signals 306 at all of the N oscillation bands (S428).

On the basis of results that are obtained by measuring the frequencies of the respective frequency-divided signals 306 at all the N oscillation bands measured in step S428, the VCO controller 510 detects an oscillation band at which the injection locked frequency divider 303 is injection locked operation within the locking range (S430). Since a method for detecting an oscillation band in step S430 is identical with that described in connection with step S416 shown in FIG. 4, its explanation is omitted.

The VCO controller 510 stores an oscillation band at which the frequency of the frequency-divided signal 306 is closest to a desirable frequency, among the oscillation bands detected in both steps S426 and S430, into the lookup table 315 (S432). Calibration of the VCO 301 is thus completed.

Figure 9:
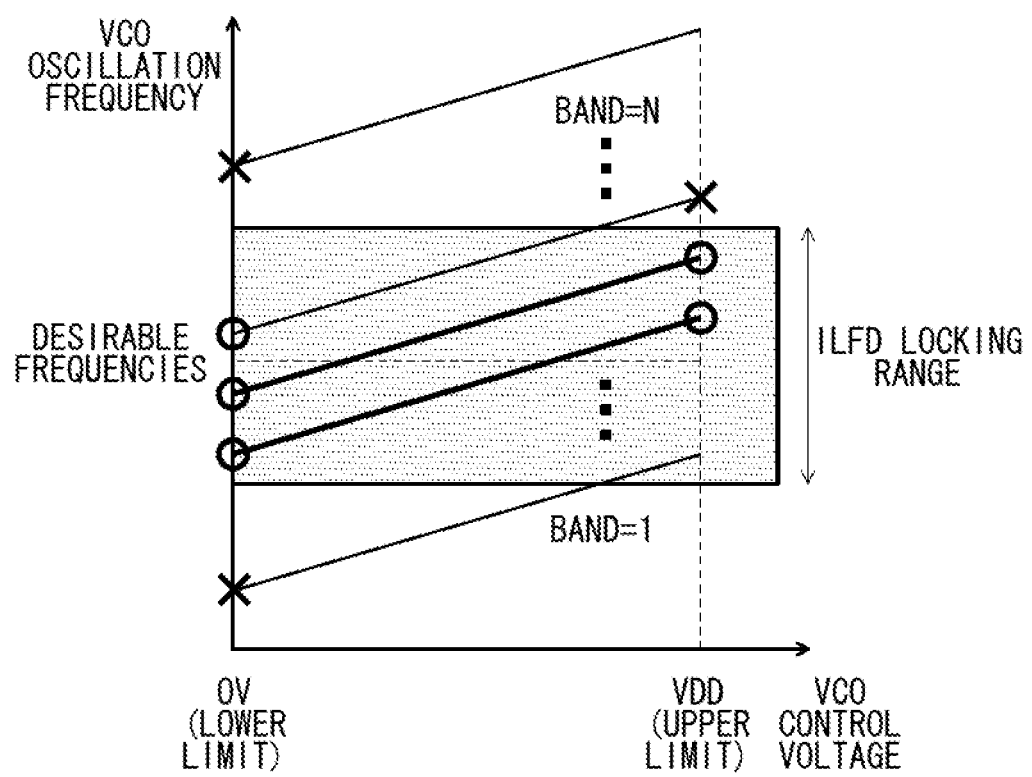
FIG. 9 is a graph showing an oscillation frequency characteristic a VCO of the second embodiment versus its control voltage and a locking range of an injection locked frequency divider.
Figure 10:
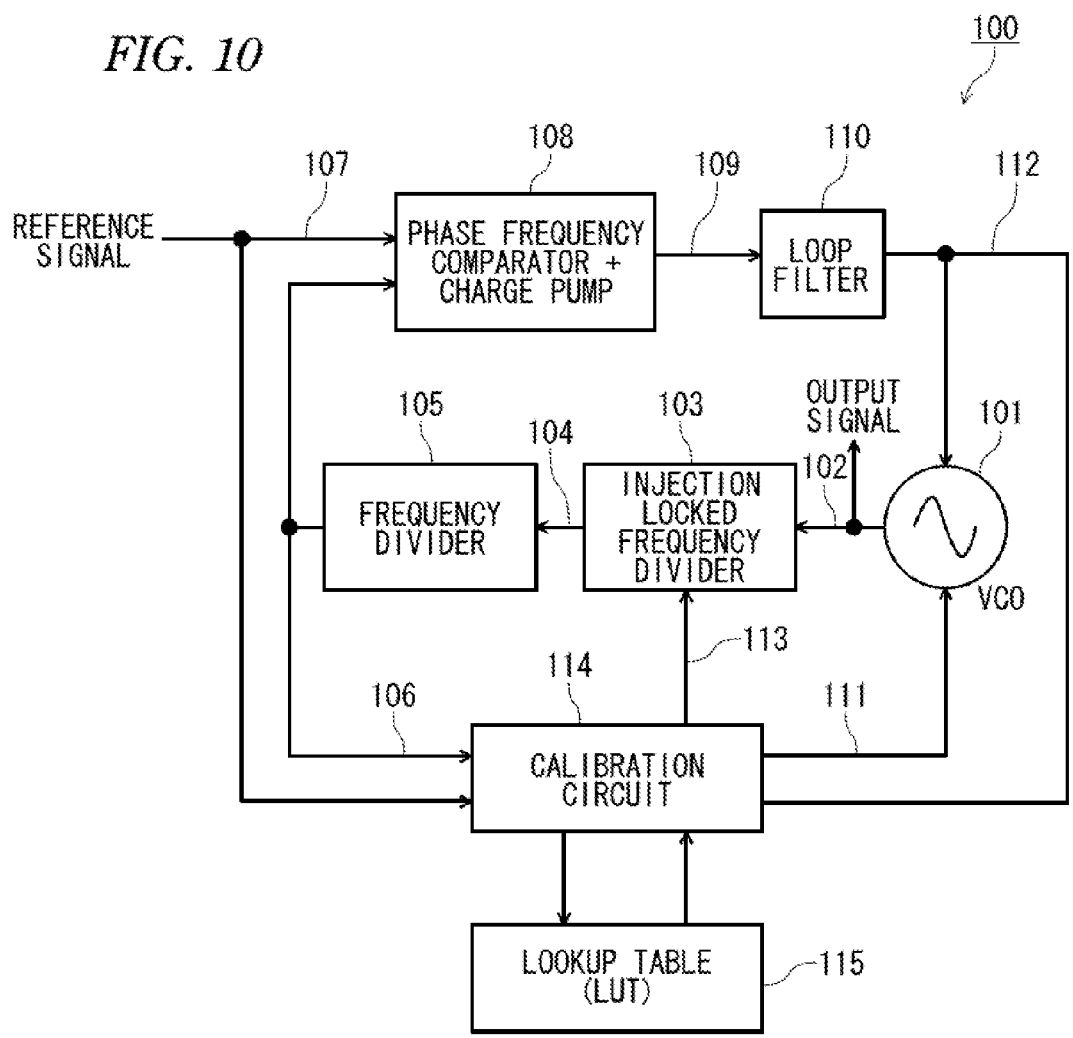
FIG. 10 is a circuit diagram of a PLL circuit using a related art injection locked frequency divider.
Figure 12A:
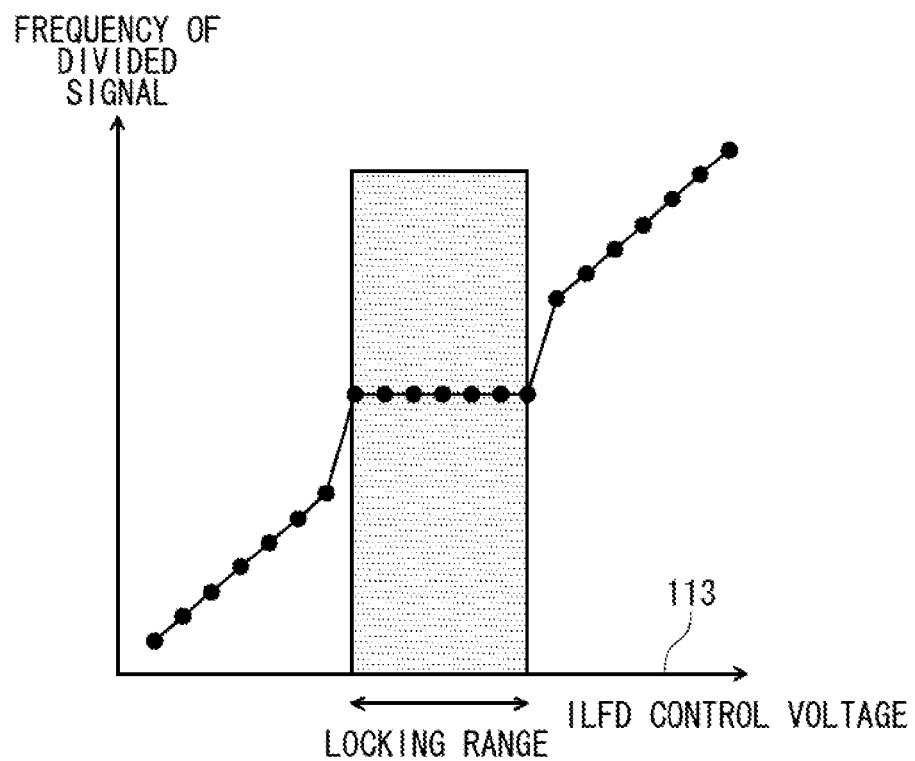
FIG. 12 is a graph showing a relationship between a control value (a control voltage) of a control signal 113 of the injection locked frequency divider 103 and a frequency of a frequency-divided signal 106 that has been frequency-divided by a frequency divider 105, wherein (a) is a graph acquired when a change interval is made short, and (b) is a graph acquired when the change interval is made long.
Figure 12B:
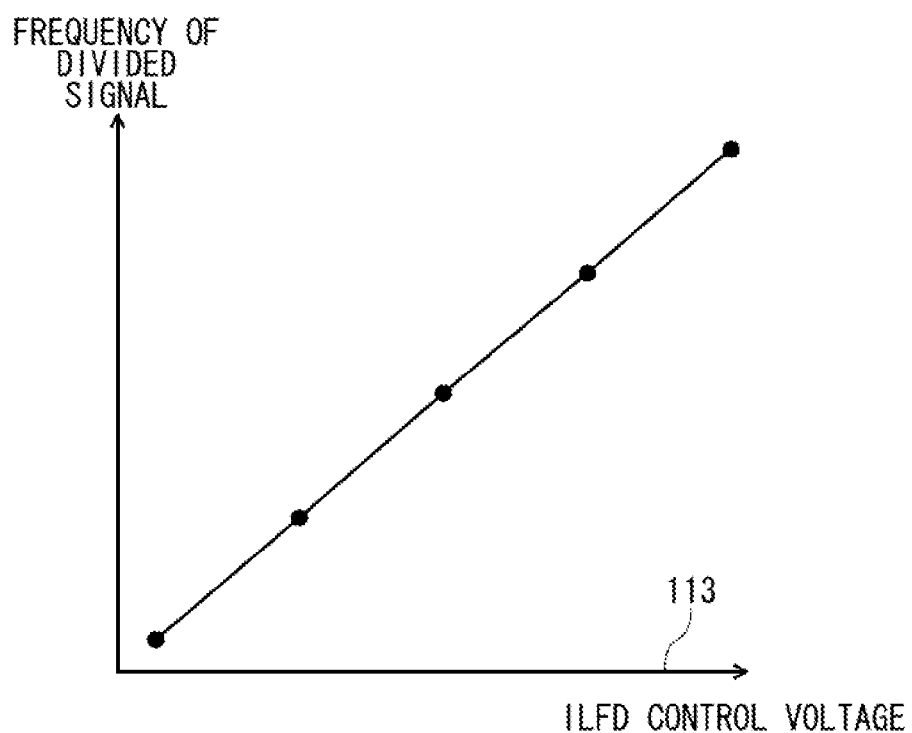

FIG. 9 is a graph showing an oscillation frequency characteristic of the VCO 301 versus its control voltage and a locking range of the injection locked frequency divider 303 of the second embodiment. With an increase in band number, the oscillation frequency of the VCO 301 also increases monotonously.

As shown in FIG. 9, the injection locked frequency divider 303 operates in synchronism with the signal injected by the VCO 301 at an oscillation band at which the oscillation frequencies of the VCO 301 corresponding to the respective control voltages 312, each of which has a predetermined lower-limit value (e.g., 0V) and a predetermined upper-limit value (e.g., the power voltage VDD), exist within a predetermined range (locking range) including desirable frequencies; namely, the oscillation bands designated by heavy lines shown in FIG. 9. Accordingly, an oscillation band which will serve as a lock range of the injection locked frequency divider 303 is detected on the basis of two values; namely a preset lower-limit value and a preset upper-limit value of the control voltage 312 of the VCO 301, whereby an oscillation band at which the injection locked frequency divider operates can be detected more accurately.

After processing pertaining to step S432, the PFD-CP controller 530 releases the output (the electric current 309) of the charge pump 308b achieved in step S428 from a fixed state. The calibration circuit 314 thereby finishes calibrating the VCO 301.

Accordingly, the PLL circuit 300 finishes calibration operation of the calibration circuit 314; namely, setting the control parameter of the injection locked frequency divider 303 and selecting an oscillation band of the VCO 301.

Even when variations occur in the conditions including processes, power voltages, and the ambient temperature, the PLL circuit 300 of the second embodiment can make the injection locked frequency divider 303 operable within the locking range more accurately within a short period of time and appropriately set the oscillation band of the VCO 301, thereby acquiring a desirable frequency more stably.

Although the embodiments have been described thus far by reference to the drawings, the invention is, needless to say, not confined to the embodiments. It is manifest that the persons skilled in the art can conceive various alterations or modifications of the embodiments within a category described in connection with the claims and that the alterations or modifications naturally fall within a technical scope of the invention.

In the first embodiment, in order to deactivate the VCO 301, the VCO controller 510 outputs to the VCO 301 the on-off signal 316 for deactivating the VCO 301.

For instance, in order to deactivate the VCO 301, a switch can be interposed between the VCO 301 and the injection locked frequency divider 303, and the VCO controller 510 can output to the switch the VCO on-off signal 316. The switch thereby disconnects electrical conduction between the VCO 301 and the injection locked frequency divider 303. Specifically, the output signal 302 from the VCO 301 is prevented from inputting to the injection locked frequency divider 303. As descried in connection with the first embodiment, there occurs a state substantially identical with deactivation of the VCO 301.

This application is based on Japanese Patent Application (Japanese Patent Application No. 2011-049211) filed on Mar. 7, 2011, the disclosure of which is incorporated herein by reference in its entirety.

INDUSTRIAL APPLICABILITY

The invention is applicable to a PLL circuit used in a handheld communication terminal and is useful for, more particularly, to a PLL circuit using an injection locked frequency divider capable of frequency-dividing a frequency signal of 10 GHz or more, a calibration method, and a wireless communication terminal.

REFERENCE SIGNS LIST

300 PLL CIRCUIT
301 VOLTAGE CONTROLLED OSCILLATOR
302 OSCILLATION SIGNAL OF VOLTAGE CONTROLLED OSCILLATOR
303 INJECTION LOCKED FREQUENCY DIVIDER
304, 306 FREQUENCY-DIVIDED SIGNAL
305 FREQUENCY DIVIDER
307 REFERENCE SIGNAL
308a PHASE FREQUENCY DETECTOR
308b CHARGE PUMP
309 ELECTRIC CURRENT
310 LOOP FILTER
311 BAND SELECTION SIGNAL
312 CONTROL VOLTAGE
313, 319 CONTROL SIGNAL
314 CALIBRATION CIRCUIT
315 LOOKUP TABLE
316 VCO ON-OFF SIGNAL
320 PFD-CP ON-OFF SIGNAL
510 VCO CONTROLLER
520 ILFD CONTROLLER
521 DAC
530 PFD-CP CONTROLLER
550 CLOCK COUNTER

The invention claimed is:

1. A PLL circuit comprising:
a voltage controlled oscillator configured to output a high frequency signal;
an injection locked frequency divider configured to frequency-divide the output high frequency signal;
a frequency divider configured to frequency-divide the frequency-divided signal into a frequency of a reference signal;
a phase frequency detector configured to compare the frequency-divided signal from the frequency divider with the reference signal and configured to output a phase difference and a frequency difference;
a charge pump configured to convert the output phase difference and the frequency difference into an electric current;
a loop filter configured to generate a control voltage for the voltage controlled oscillator in accordance with the thus-converted electric current and configured to apply the generated control voltage to the voltage controlled oscillator; and
a calibration circuit configured to control an oscillation band which determines an oscillation frequency of the voltage controlled oscillator and configured to control a control parameter for activating the injection locked frequency divider in a determined operating range, wherein
the calibration circuit is configured to adjust the oscillation band of the voltage controlled oscillator in accordance with a frequency-divided signal of the adjusted injection locked frequency divider after adjustment of the control parameter of the injection locked frequency divider.

2. The PLL circuit according to claim 1, wherein the calibration circuit further includes
a VCO controller configured to control operation of the voltage controlled oscillator, and
an ILFD controller configured to control operation of the injection locked frequency divider, wherein
the VCO controller is configured to deactivate the voltage controlled oscillator when the ILFD controller adjusts the control parameter of the injection locked frequency divider.

3. The PLL circuit according to claim 2, wherein the calibration circuit further includes
a clock counter configured to measure a frequency of a frequency-divided signal which has been frequency-divided in accordance with a control signal including the control parameter and a frequency of the reference signal, wherein
the ILFD controller is configured to set the control parameter for the injection locked frequency divider when a difference exists between the measured frequency of the frequency-divided signal and the measured frequency of the reference signal.

4. The PLL circuit according to claim 2, wherein the calibration circuit further includes
a clock counter configured to measure a frequency of the frequency-divided signal which has been frequency-divided in accordance with a control signal including the control parameter and a frequency of the reference signal, wherein
the ILFD controller is configured to set the control parameter for the injection locked frequency divider on the basis of the measured frequency of the frequency-divided signal and the measured frequency of the reference signal.

5. The PLL circuit according to claim 3, wherein the VCO controller is configured to release the voltage controlled oscillator from a deactivated state after setting the control parameter for the injection locked frequency divider and select the oscillation band for determining an oscillation frequency of the voltage controlled oscillator.

6. The PLL circuit according to claim 5, wherein the VCO controller is configured to select another oscillation band of the voltage controlled oscillator when a frequency of a signal, which is output from the voltage controlled oscillator in accordance with the selected oscillation band, differs from a frequency of the reference signal and a frequency of a frequency-divided signal which has been frequency-divided by the injection locked frequency divider and by the frequency divider.

7. The PLL circuit according to claim 5, wherein the VCO controller is configured to select the oscillation band of the voltage controlled oscillator on the basis of a frequency of a frequency-divided signal that is obtained by frequency-dividing a signal, which is output from the voltage controlled oscillator according to the selected oscillation band, by means of the injection locked frequency divider and the frequency divider, and a frequency of the reference signal.

8. The PLL circuit according to claim 6, further comprising a lookup table configured to store the oscillation band of the voltage controlled oscillator and the control parameter of the injection locked frequency divider when the frequency of the frequency-divided signal and the frequency of the reference signal comes close to each other.

9. A wireless communication terminal comprising:
the PLL circuit defined in claim 1;
a modulator configured to modulate a baseband transmission signal;
a transmission mixer configured to produce, by means of frequency conversion, a carrier frequency from a first local signal output from the PLL circuit and the modulated transmission signal; and
a receiving mixer configured to produce, by means of frequency conversion, a baseband signal from a second local signal output from the PLL circuit and a received signal; and
a demodulator configured to demodulate the frequency-converted received signal.

10. A calibration method comprising:
deactivating operation of a voltage controlled oscillator configured to output a high frequency signal;
measuring a frequency of a frequency-divided signal which is obtained by frequency-dividing in accordance with a control signal including a control parameter of an injection locked frequency divider for frequency-dividing the high frequency signal and a frequency of a determined reference signal;
setting the control parameter of the injection locked frequency divider in accordance with the measured frequency of the frequency-divided signal and the frequency of the reference signal;
releasing the voltage controlled oscillator from a deactivated state;
selecting an oscillation band that determines an oscillation frequency of the voltage controlled oscillator; and
selecting the oscillation band of the voltage controlled oscillator on the basis of a frequency of a frequency-divided signal that is obtained by frequency-dividing a signal, which is output from the voltage controlled oscillator according to the selected oscillation band, by means of the injection locked frequency divider and the frequency divider, and a frequency of the reference signal.

* * * * *